United States Patent
Wada (10) Patent No.: US 9,847,231 B2
(45) Date of Patent: Dec. 19, 2017

(54) METHOD OF ETCHING

(71) Applicant: Tokyo Electron Limited, Tokyo (JP)

(72) Inventor: Toshiharu Wada, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/351,828

(22) Filed: Nov. 15, 2016

(65) Prior Publication Data

US 2017/0154784 A1 Jun. 1, 2017

(30) Foreign Application Priority Data

Nov. 27, 2015 (JP) .................. 2015-231532

(51) Int. Cl.
| | |
|---|---|
| *H01L 21/3065* | (2006.01) |
| *H01L 21/311* | (2006.01) |
| *H01L 21/67* | (2006.01) |
| *H01J 37/32* | (2006.01) |
| *H01L 21/3213* | (2006.01) |

(52) U.S. Cl.
CPC .... *H01L 21/3065* (2013.01); *H01J 37/32009* (2013.01); *H01J 37/3244* (2013.01); *H01J 37/32091* (2013.01); *H01J 37/32532* (2013.01); *H01L 21/31116* (2013.01); *H01L 21/31138* (2013.01); *H01L 21/31144* (2013.01); *H01L 21/32136* (2013.01); *H01L 21/32137* (2013.01); *H01L 21/67069* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,171,974 B1 * | 1/2001 | Marks | ................... C23C 16/517 257/E21.252 |
| 2014/0256147 A1 * | 9/2014 | Watanabe | ......... H01J 37/32091 438/710 |

FOREIGN PATENT DOCUMENTS

JP    2008-060566    3/2008

* cited by examiner

*Primary Examiner* — Jiong-Ping Lu
(74) *Attorney, Agent, or Firm* — IPUSA, PLLC (57) ABSTRACT

A method of etching an insulation layer on an object to be processed in a process chamber in which an upper electrode and a lower electrode are placed facing each other, includes supplying a process gas that includes fluorocarbon gas and silicon tetrafluoride ($SiF_4$) gas into the process chamber; applying high frequency power to at least one of the upper electrode and the lower electrode, to generate plasma; and etching the insulation layer by the generated plasma via a mask.

7 Claims, 10 Drawing Sheets

| | COMPARATIVE EXAMPLE<br>VIA STEP (SiF₄ NOT ADDED) | PRESENT EMBODIMENT<br>VIA STEP (SiF₄ ADDED) | PRESENT EMBODIMENT<br>TRENCH STEP (SiF₄ ADDED) |
|---|---|---|---|
| PLAN (L/S) | | | |
| CROSS SECTION (L/S) | | | |
| MASK ENCROACHMENT (TiN) | 18.4 | 8.2 | 14.2 |
| RESIDUAL MASK FILM (TiN) | 8.3 | 9.2 | 8.2 |
| CROSS SECTION (L/S) | | | |
| RESIDUAL MASK FILM (TiN) | 14.4 | 16.8 | 18.8 |

| DISTANCE FROM EDGE OF WAFER | SiF₄ ADDED BY AMOUNT A | | SiF₄ ADDED BY AMOUNT B > A | |
|---|---|---|---|---|
| | 30 mm | 5 mm | 30 mm | 5 mm |
| CROSS SECTION (L/S) | | | | |
| TCD/MCD/BCD | 63.5/65.6/62.2 nm | 75.4/66.2/59.2 nm | 64.3/64.6/59.2 nm | 70.1/66.0/55.2 nm |

METHOD OF ETCHING

CROSS-REFERENCE TO RELATED APPLICATIONS

This patent application is based upon and claims the benefit of priority of Japanese Patent Application No. 2015-231532, filed on Nov. 27, 2015, the entire contents of which are incorporated herein by reference.

BACKGROUND OF THE INVENTION

1. Field of the Invention

The present disclosure relates to a method of etching.

2. Description of the Related Art

Technologies have been proposed for microfabrication of circuit patterns of semiconductor devices on semiconductor wafers (also referred to as "wafers", below) by using etching apparatuses (see, for example, Patent Document 1). In Japanese Laid-open Patent Publication No. 2008-60566, a technology has been disclosed that prevents bowing when etching an insulation layer on a wafer.

However, to meet demand for even finer microfabrication in recent years, a highly precise etching process needs to be realized, for which it has become important for such a process to maintain in-plain uniformity of etching executed on a wafer, and at the same time, to increase selectivity that represents a ratio of etching a mask with respect to etching a film to be etched (referred to as the "mask selectivity", below).

SUMMARY OF THE INVENTION

In view of the above problem, it is an object of an aspect in the present disclosure to improve the mask selectivity.

According to an embodiment, a method of etching an insulation layer on an object to be processed in a process chamber in which an upper electrode and a lower electrode are placed facing each other, includes supplying a process gas that includes fluorocarbon gas and silicon tetrafluoride ($SiF_4$) gas into the process chamber; applying high frequency power to at least one of the upper electrode and the lower electrode, to generate plasma; and etching the insulation layer by the generated plasma via a mask.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 7 is a table of diagrams illustrating examples of results of etching when methods of etching according to an embodiment is applied to a via step and the like;

DETAILED DESCRIPTION OF THE PREFERRED EMBODIMENTS

In the following, embodiments will be described with reference to the drawings. Note that the same reference symbols are assigned to substantially the same elements throughout the specification and the drawings, and duplicated description will be omitted.

[Overall Configuration of Plasma Etching Apparatus]

Figure 1:
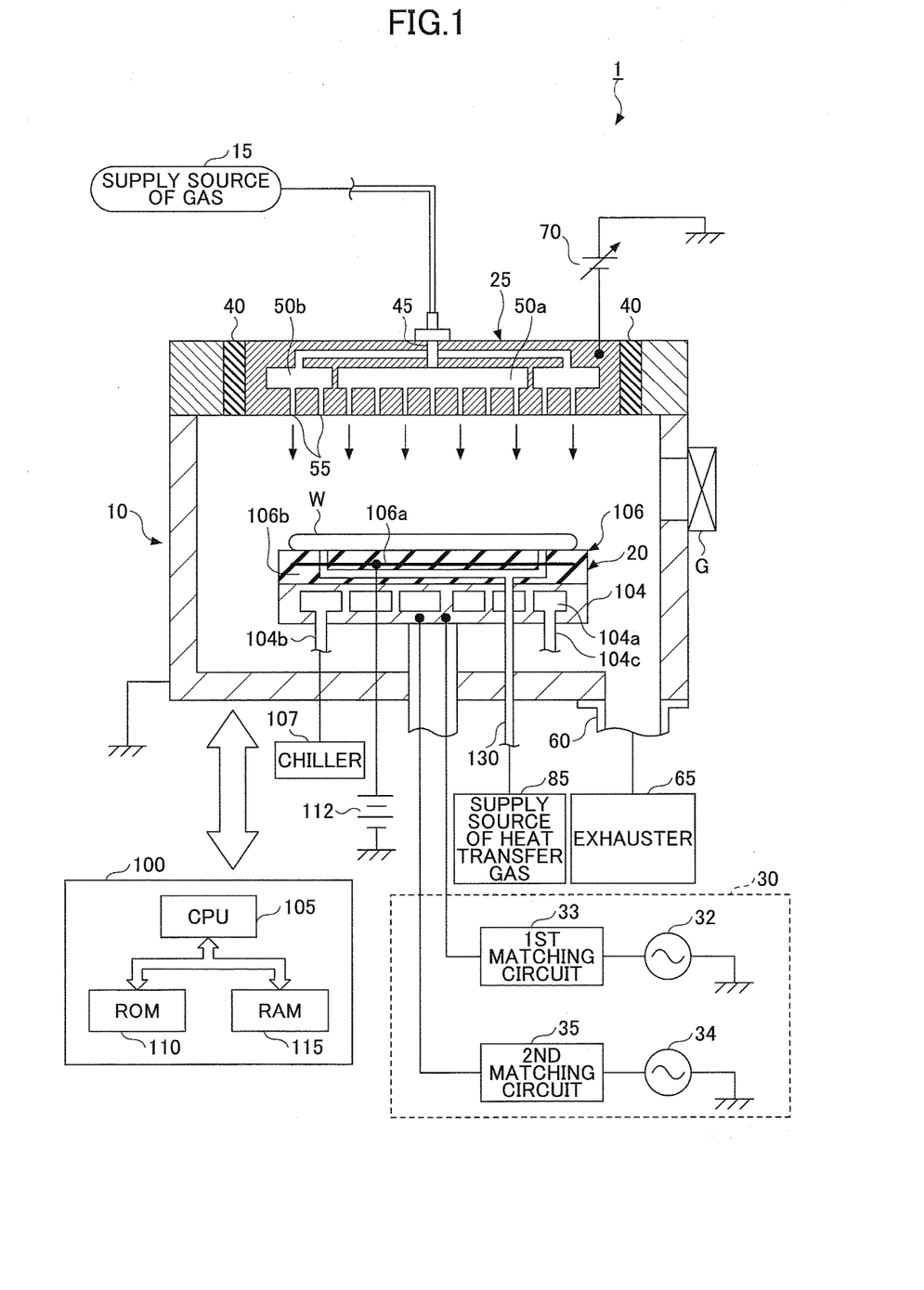
FIG. 1 is a diagram illustrating an example of a vertical cross section of an etching apparatus according to an embodiment.

First, an etching apparatus 1 will be described with reference to FIG. 1 that executes plasma-etching a semiconductor wafer (simply referred to as a "wafer", below) by a method of etching according to an embodiment in the present disclosure. FIG. 1 illustrates an example of a vertical cross section of the etching apparatus 1 according to the embodiment. The etching apparatus 1 according to the embodiment is a parallel-plate plasma etching apparatus (a capacitively coupled plasma etching apparatus) in which a holding table 20 that also functions as a lower electrode, and a gas shower head 25 that also functions as an upper electrode, are placed facing each other.

The etching apparatus 1 includes a process chamber 10 that is formed of, for example, aluminum having an alumite treatment (anodic oxidation) applied to the surface, and has a cylinder shape. The process chamber 10 is electrically grounded. The holding table 20 is disposed at a bottom part in the process chamber 10, on which a wafer W is held. The wafer W is an example of an object to be processed. The holding table 20 is formed of, for example, aluminum (Al), titanium (Ti), silicon carbide (SiC), and the like. On the upper surface of the holding table 20, an electrostatic chuck 106 is provided to electrostatically attract the wafer W. The electrostatic chuck 106 has a structure in which a chuck electrode 106a is interposed between insulators 106b. The chuck electrode 106a is connected to a DC voltage source 112, from which a DC voltage HV is applied to the chuck electrode 106a so that Coulomb force attracts the wafer W to the electrostatic chuck 106.

The holding table 20 is supported by a support 104. A coolant passage 104a is formed in the support 104. The coolant passage 104a has a coolant inlet pipe 104b and a coolant outlet pipe 104c connected. A cooling medium such as cooling water and brine (also referred to as the "coolant", below) output from a chiller 107, circulates through the coolant inlet pipe 104b, the coolant passage 104a, and the coolant outlet pipe 104c. The coolant releases the heat of the holding table 20 and the electrostatic chuck 106 to be cooled down.

A supply source of heat transfer gas 85 supplies heat transfer gas such as helium gas (He) and argon gas (Ar) to the reverse side of the wafer W on the electrostatic chuck 106 through a gas supply line 130. Configured as such, the temperature of the electrostatic chuck 106 is controlled by the cooling medium circulated through the coolant passage 104a, and the heat transfer gas supplied to the reverse side of the wafer W. Consequently, the wafer W can be controlled to maintain a predetermined temperature.

The holding table 20 is connected with a power supply apparatus 30 that supplies two-frequency superposed power. The power supply apparatus 30 includes a first high frequency power source 32 to supply first high frequency power (high frequency power for generating plasma) at a first frequency, and a second high frequency power source 34 to supply second high frequency power (high frequency power for generating bias voltage) at a second frequency lower than the first frequency. The first high frequency power source 32 is electrically connected with the holding table 20 via a first matching circuit 33. The second high frequency power source 34 is electrically connected with the holding table 20 via a second matching circuit 35. The first high frequency power source 32 applies the first high frequency power HF for generating plasma, for example, at 60 MHz to the holding table 20. The second high frequency power source 34 applies the second high frequency power LF for generating bias voltage, for example, at 13.56 MHz to the holding table 20. Note that although the first high frequency power HF is applied to the holding table 20 in the embodiment, the power may be applied to the gas shower head 25.

The first matching circuit 33 makes the load impedance match with the internal (or output) impedance of the first high frequency power source 32. The second matching circuit 35 makes the load impedance match with the internal (or output) impedance of the second high frequency power source 34. The first matching circuit 33 functions so that the internal impedance of the first high frequency power source 32 seemingly match with the load impedance when plasma is being generated in the process chamber 10. Also, the second matching circuit 35 functions so that the internal impedance of the second high frequency power source 34 seemingly match with the load impedance when plasma is being generated in the process chamber 10.

The gas shower head 25 is attached to the process chamber 10 so as to cover up an opening at the ceiling part of the process chamber 10, together with a shield ring 40 covering the periphery of the gas shower head 25. The gas shower head 25 is connected to a variable DC power source 70 from which a predetermined DC voltage is applied to the gas shower head 25. The gas shower head 25 may be formed of silicon.

The gas shower head 25 has a gas inlet 45 formed to introduce gas. In the gas shower head 25, a diffusion chamber 50a around the center, and a diffusion chamber 50b close to the edge are provided, branched off from the gas inlet 45. Gas output from a gas supply source 15 is supplied to the diffusion chambers 50a-50b via the gas inlet 45, diffused in the respective diffusion chambers 50a-50b, and introduced into the process chamber 10 from a number of gas supply holes 55 towards the holding table 20.

The process chamber 10 has an exhaust opening 60 formed on the bottom surface, through which the gas in the process chamber 10 is exhausted by an exhauster 65 connected to the exhaust opening 60. Thus, a predetermined degree of vacuum can be maintained in the process chamber 10. On a side wall of the process chamber 10, a gate valve G is provided. The gate valve G is opened and closed when the wafer W is taken in and out of the process chamber 10.

The etching apparatus 1 has a control unit 100 to control operations of the apparatus as a whole. The control unit 100 includes a CPU (Central Processing Unit) 105, a ROM (Read-Only Memory) 110, and a RAM (Random Access Memory) 115. The CPU 105 executes desired processes including etching, which will be described later, following various recipes stored in these memories. A recipe describes control information about the apparatus with respect to etching conditions, including process time, pressure (gas exhaustion), high frequency power, voltage, various amounts of gas flow, temperatures in the process chamber (temperature of the upper electrode, temperature of the side wall of the chamber, temperature of the wafer W, temperature of the electrostatic chuck, etc.), and temperature of the chiller 107. Note that these programs and the recipes describing the process conditions may be stored in a hard disk or a semiconductor memory. Also, the recipes may be contained in a portable, computer-readable recording medium, such as a CD-ROM and a DVD, to be loaded in a predetermined location in the memory.

When etching is to be executed, the gate valve G is controlled to open and close, through which the wafer W is taken into the process chamber 10, and placed on the holding table 20. By applying the DC voltage HV from the DC voltage source 112 to the chuck electrode 106a, the wafer W is attracted to the electrostatic chuck 106 and held by the Coulomb force.

Next, the process gas and the high frequency power are supplied into the process chamber 10 to generate plasma, and by the generated plasma, the wafer W is processed. After the process by the plasma has completed, the DC voltage HV is applied to the chuck electrode 106a, with a polarity reverse to that applied when having the wafer W attracted, so as to discharge the electric charge of the wafer W, and to remove the wafer W from the electrostatic chuck 106. Then, the gate valve G is controlled to open and close, through which the wafer W is taken out of the process chamber 10.

[Method of Etching]

In the embodiment, by using the etching apparatus 1 configured as described above, etching is executed on a silicon oxide film ($SiO_x$) with a resist film as the mask, which may be polysilicon (Poly-Si), a silicon nitride (SiN) film, photoresist (PR), a titanium nitride (TiN) film, or the like. However, the types of the mask are not limited to the examples described above. Also, the film to be etched is not limited to a silicon oxide film; the etching by the embodiment may be applied to an insulation layer such as a low-k film.

Figure 2:
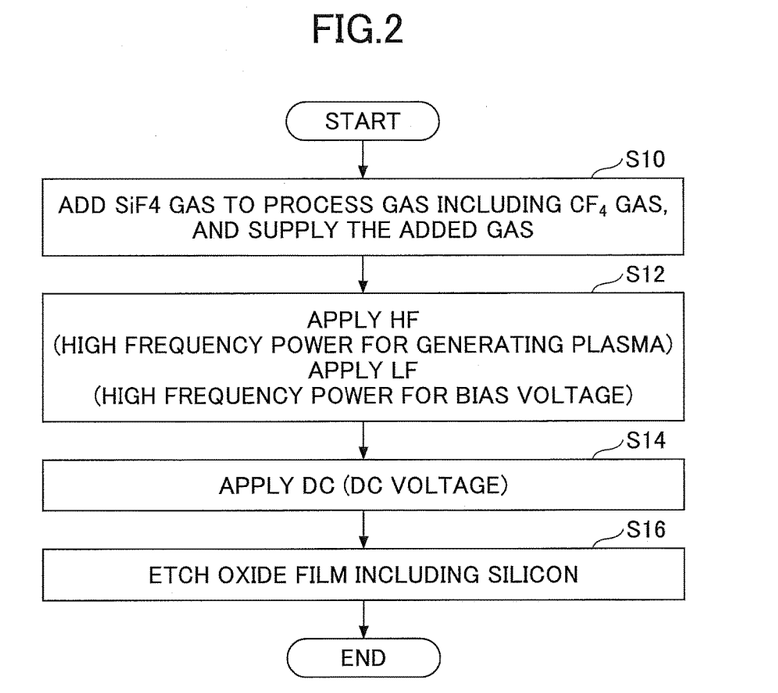
FIG. 2 is a flowchart illustrating an example of a method of etching according to an embodiment.

When the wafer W is taken into the process chamber 10, and held on the holding table 20, the control unit 100 starts executing the method of etching according to the embodiment illustrated in FIG. 2. First, the control unit 100 supplies mixed gas of fluorocarbon gas (gas that includes carbon and fluorine) added with silicon tetrafluoride ($SiF_4$) gas, from the supply source of gas 15 into the process chamber 10 (Step S10). In the embodiment, carbon tetrafluoride ($CF_4$) gas is supplied as an example of gas that includes carbon (C) gas and fluorine (F) gas. However, the fluorocarbon gas is not limited to $CF_4$ gas, but may be octafluorocyclobutane ($C_4F_8$) gas, hexafluoro-1, 3-butadiene ($C_4F_6$) gas, or the like.

Next, the control unit 100 applies the first high frequency power HF (high frequency power for generating plasma) at the first frequency output from the first high frequency power source 32 to the holding table 20 that functions as the lower electrode (Step S12). The control unit 100 also applies the second high frequency power LF (high frequency power for generating bias voltage) at the second frequency output from the second high frequency power source 34 to the holding table 20 (Step S12).

Next, the control unit 100 outputs a negative DC voltage DC to the gas shower head 25 that functions as the upper electrode, from the variable DC power source 70 (Step S14). Under the etching conditions set up by Steps S10 to S14 as above, plasma is generated, and by the action of the plasma, an Si-containing oxide film, for example, a silicon oxide film ($SiO_x$) is etched via the mask (Step S16), and the process ends.

Note that the second high frequency power LF may not be applied to at Step S12. Also, the negative DC voltage DC may not be applied to at Step S14. However, it is preferable to apply the negative DC voltage DC for improving the mask selectivity, as will be described later.

[Etching Result 1]

Figure 4:
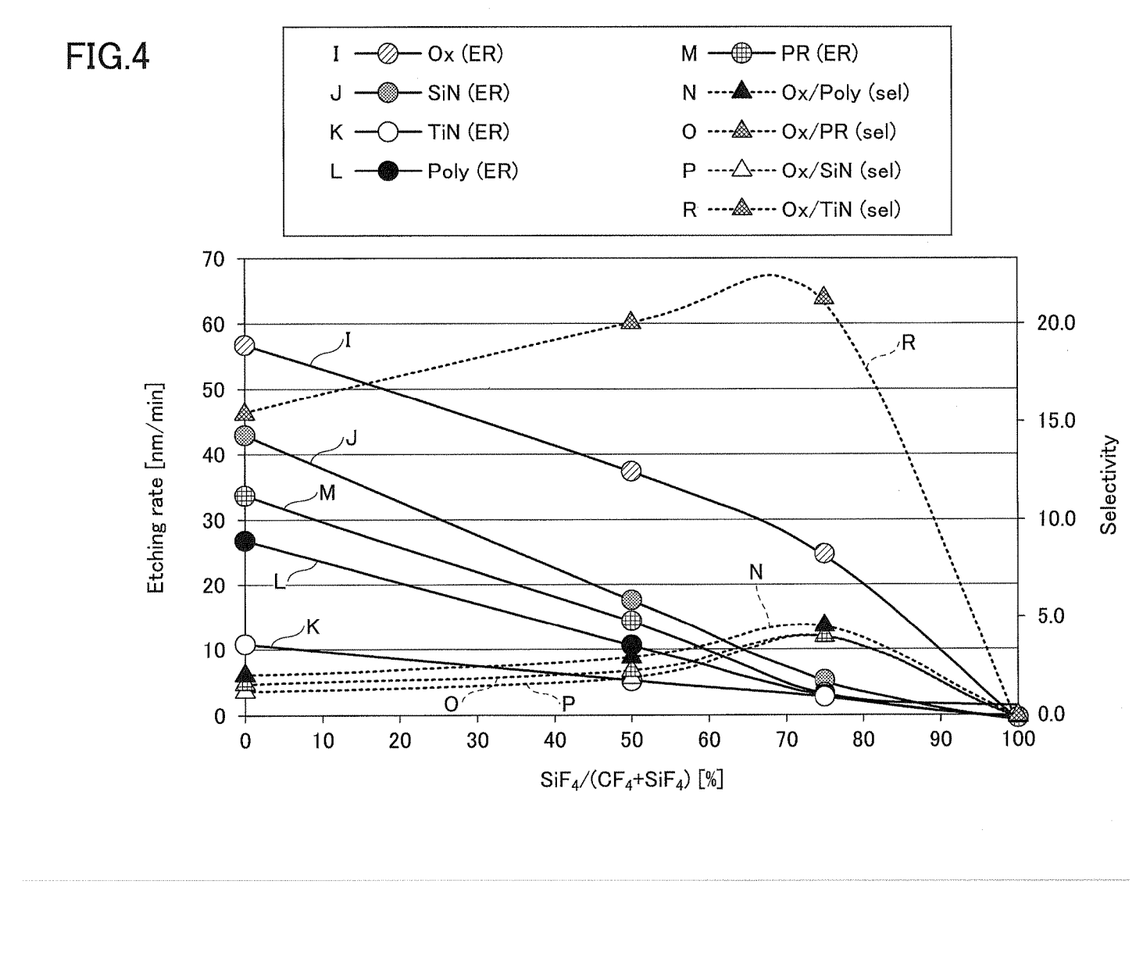
FIG. 4 is a diagram illustrating an example of a result of etching by a method of etching according to an embodiment.
Figure 5:
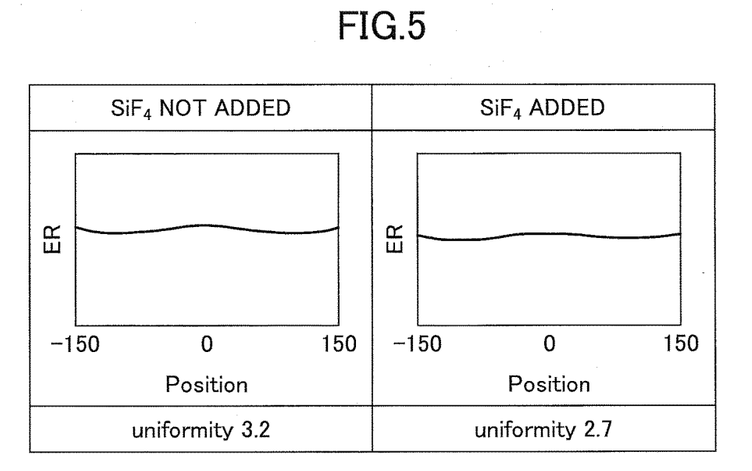
FIG. 5 is a diagram illustrating an example of a result of etching by a method of etching according to an embodiment.

An example of an etching result 1 according to the embodiment described above will be described based on FIG. 3 to FIG. 5. Graphs in FIG. 3 to FIG. 5 represent results of etching a silicon oxide film ($SiO_2$) by the method of etching according to the embodiment under the following etching conditions.

(Etching Conditions)
the temperature of the placing table: 10° C.;
the first high frequency power HF: 300 W;
the second high frequency power LF: 100 W;
the negative DC voltage DC: both cases of applied and not applied;
the gas: $CF_4$, $SiF_4$; and
the pressure: 80 mT (10.67 Pa).

Figure 3:
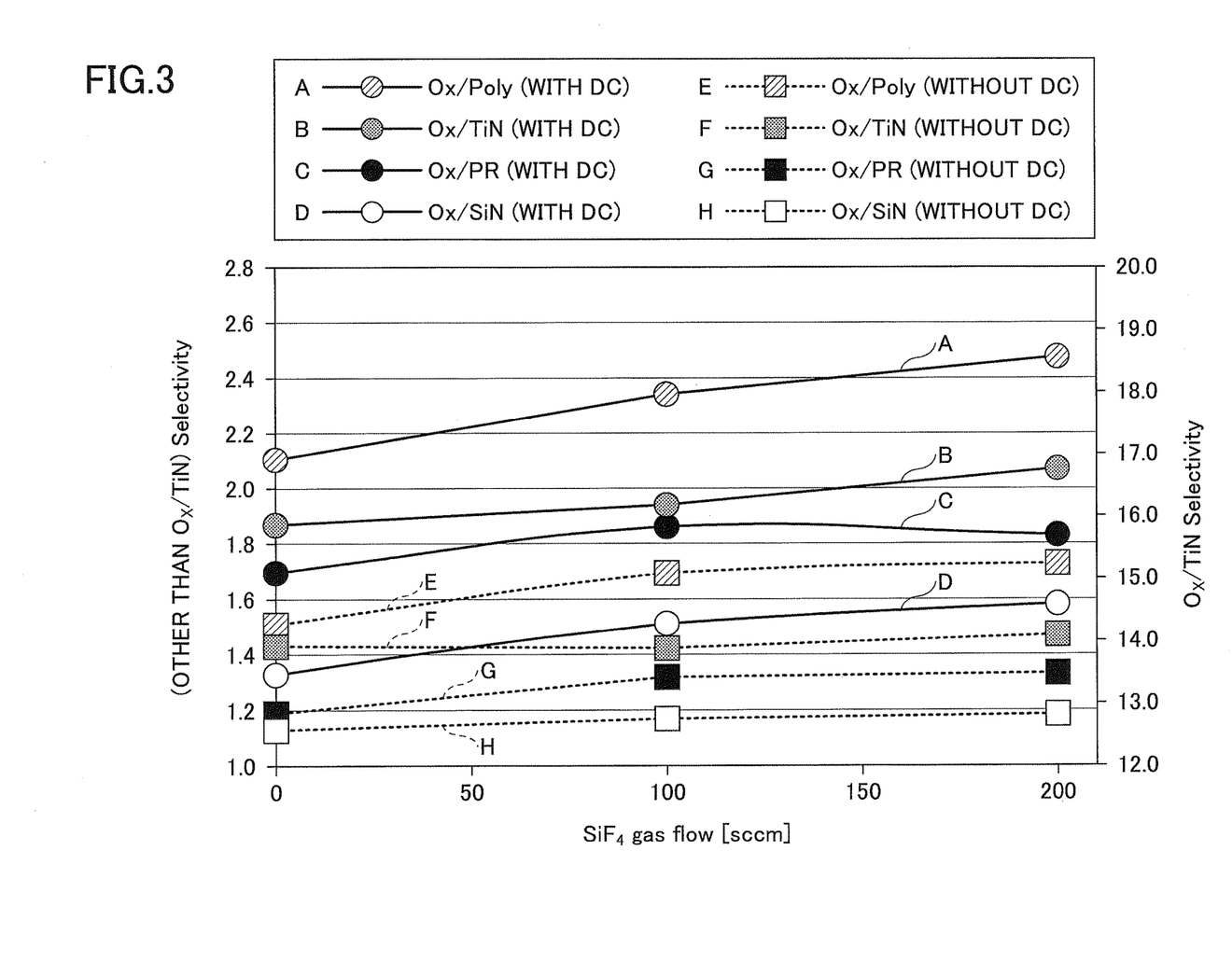
FIG. 3 is a diagram illustrating an example of a result of etching by a method of etching according to an embodiment.

The horizontal axis of the graph in FIG. 3 represents the amount of flow of supplied $SiF_4$ gas, and the vertical axis represents the mask selectivity. Solid lines A, B, C, and D represent etching results of cases where the negative DC voltage DC was applied during the etching. Specifically, the solid line A represents the mask selectivity obtained when etching the silicon oxide film with a resist film of polysilicon as the mask. The solid line B represents the mask selectivity obtained when etching the silicon oxide film with a titanium nitride (TiN) film as the mask (a metal hard mask). The solid line C represents the mask selectivity obtained when etching the silicon oxide film with a photoresist film (PR) as the mask. The solid line D represents the mask selectivity obtained when etching the silicon oxide film with a silicon nitride (SiN) film as the mask.

Note that the vertical axis on the right side represents the mask selectivity with the titanium nitride film as the mask, and the vertical axis on the left side represents the mask selectivity with a mask of other than titanium nitride.

On the other hand, dotted lines E, F, G, and H represent etching results of cases where the negative DC voltage DC was not applied during the etching. The dotted line E represents the mask selectivity obtained when etching the silicon oxide film with the same mask as in the solid line A. Similarly, the dotted lines F, G, and H represent the mask selectivities obtained when etching the silicon oxide film with the same masks as in the solid lines B, C, and D, respectively.

It can be seen from the results in FIG. 3 that the mask selectivity can be improved by the method of etching according to the embodiment if the $SiF_4$ gas is added to $CF_4$ gas. Also, the mask selectivity can be improved more by adding a greater amount of $SiF_4$ gas with respect to the $CF_4$ gas. Further, in the case of the titanium nitride (TiN) film, the mask selectivity is notably higher than in the cases of etching with the masks of the other materials. Moreover, it can be seen that the mask selectivity can be further improved by applying DC during the etching. However, if the amount of flow of the $SiF_4$ gas becomes too much, etching the silicon oxide film or the like may become difficult.

The horizontal axis in FIG. 4 represents the flow ratio of the $SiF_4$ gas to the entire gas ($CF_4$+$SiF_4$), with the negative DC voltage DC applied during the etching. The vertical axis (on the left side) in FIG. 4 represents the etching rate of $SiO_2$ (referred to as the "ER", below). The vertical axis (on the right side) in FIG. 4 represents the mask selectivity.

Solid lines I, J, K, L, and M in graphs in FIG. 4 represent the ERs, and dotted lines N, O, P, and R represents the mask selectivities. The solid line I represents the ER obtained when etching the silicon oxide film with an oxide film ($O_x$) as the mask. The solid line J represents the ER obtained when etching the silicon oxide film with a silicon nitride (SiN) film as the mask. The solid line K represents the ER obtained when etching the silicon oxide film with a titanium nitride (TiN) film as the mask. The solid line L represents the ER obtained when etching the silicon oxide film with a polysilicon film (Poly) as the mask. The solid line M represents the ER obtained when etching the silicon oxide film with photoresist (PR) as the mask.

Also, the dotted line N in FIG. 4 represents the mask selectivity obtained when etching the silicon oxide film with a polysilicon film (Poly) as the mask. The dotted line O represents the mask selectivity obtained when etching the silicon oxide film with photoresist (PR) as the mask. The dotted line P represents the mask selectivity obtained when etching the silicon oxide film with a silicon nitride (SiN) film as the mask. The dotted line R represents the mask selectivity obtained when etching the silicon oxide film with a titanium nitride (TiN) film as the mask.

From the above results, it can be seen that the mask selectivity is improved by adding the $SiF_4$ gas, with any of the materials used for the dotted lines N, O, P, and R as the mask. It is especially preferable to apply DC during the etching, and to control the amount of added $SiF_4$ gas so that the flow ratio of the $SiF_4$ gas to the entire gas ($CF_4$+$SiF_4$) falls in a range from 10% to 75%. Thus, the mask selectivity can be raised.

Further, from the results of FIG. 4, it is more preferable to apply DC during the etching, and to control the amount of added $SiF_4$ gas so that the flow ratio of the $SiF_4$ gas to the entire gas ($CF_4$+$SiF_4$) falls in a range from 50% to 75%, because the mask selectivity can be improved even higher.

Also, it can be seen that although the ER is reduced a bit by adding the $SiF_4$ gas, the in-plain uniformity of the ER is maintained in the direction along the diameter of the wafer W, with any of the materials as the masks used in the solid lines I, J, K, L, and M, as illustrated in FIG. 5. In other words, even when the $SiF_4$ gas was added, the in-plain uniformity of the ER in the direction along the diameter of the wafer is "2.7", which can be regarded that the in-plain uniformity of the ER is maintained, considering the similar value "3.2" of the in-plain uniformity of the ER in the direction along the diameter of the wafer in the case where the $SiF_4$ gas was not added.

[Etching Result 2]

Figure 6A:
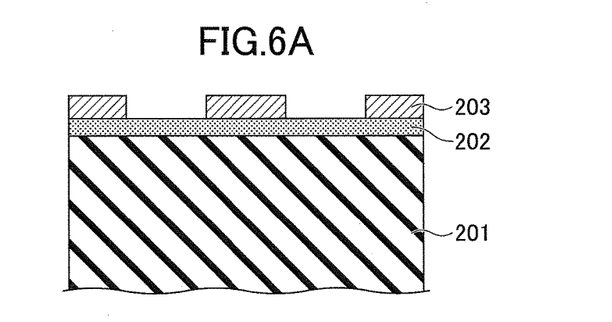
FIGS. 6A-6B are diagrams illustrating etching that uses SAV.
Figure 6B:
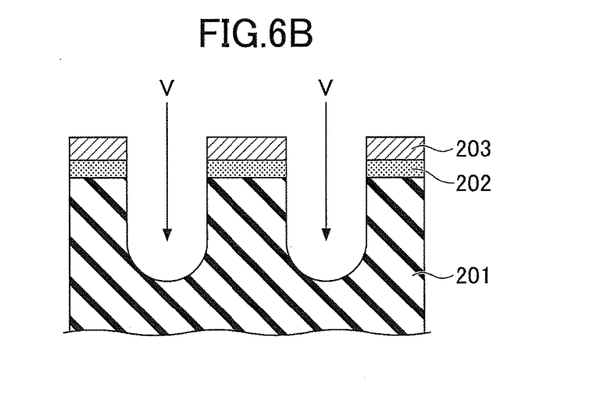

Next, an etching result 2 will be described in a case where the method of etching according to the embodiment is applied. The method of etching according to the embodiment described above can be used, for example, in a method of etching that uses self-aligned vias (SAV). In a method using SAV, the method of etching according to the embodiment is executed with a hard mask formed of an organic film such as resist and a metal-containing film such as titanium nitride, as the mask. This makes it possible that holes are formed, for example, into a low-permittivity film (a low-k film) that is used as a film between wiring layers. With reference to FIG. 6, the method of etching according to the embodiment using SAV will be described.

In the method of etching that uses SAV, when etching a low-permittivity film (a low-k film) by plasma of a process gas that includes fluorocarbon gas, an organic film and a metal-containing film are used as the mask for the etching, to form holes and the like into the low-k film. Note that a low-k film is a generic term of films that have the relative permittivity lower than that of $SiO_2$.

As illustrated in FIG. 6A, a low-k film 201 as a film to be etched is staked on the wafer W, and a tetraethoxysilane (TEOS) film 202 and a TiN film 203 are further stacked in this order on the low-k film 201. The TiN film 203 is an example of a metal-containing film. The low-k film 201 is, for example, an SiOCH film. Note that a base film may be formed between the wafer W and the low-k film 201.

When etching the wafer W by the method using SAV, first, as illustrated in FIG. 6A, etching is executed on the low-k film 201 with the TiN film 203 as the mask. Thus, as illustrated in FIG. 6B, vias V are formed into the low-k film 201 (a via step). At this moment, if the selectivity of the TiN film 203 with respect to the low-k film 201 is not sufficient, plasma-etching the low-k film 201 with the TiN film 203 as the mask, may cause a risk of so-called "encroachment", or a part of the TiN film 203 is encroached.

Figure 7:
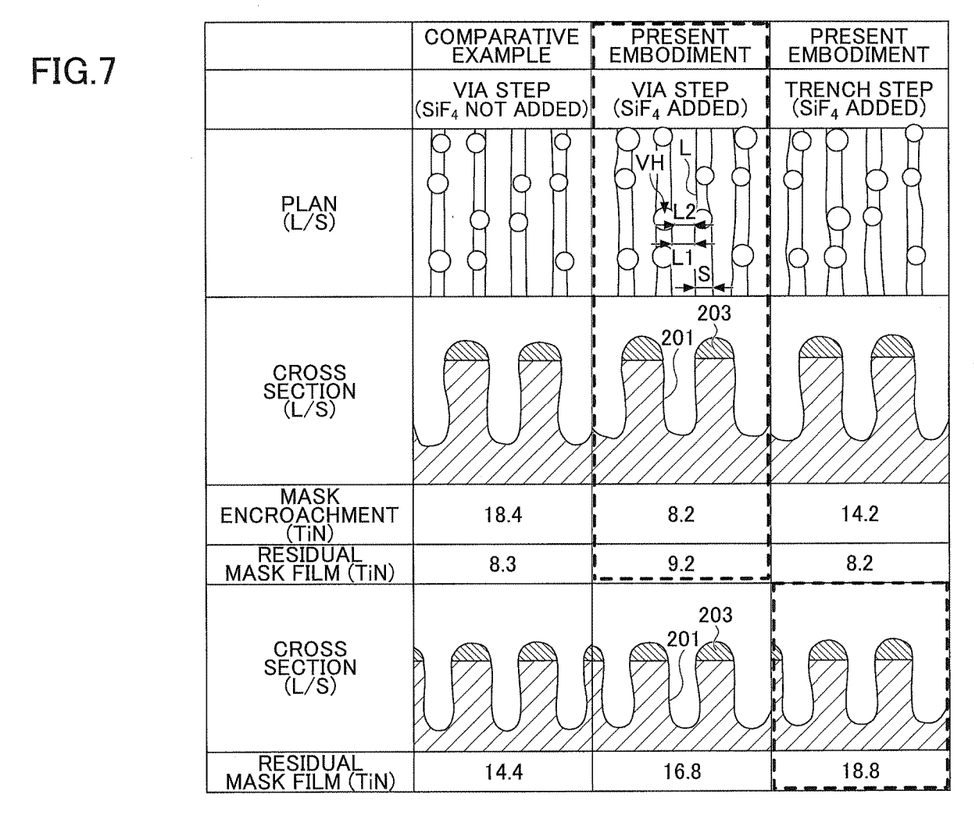

FIG. 7 is a table of diagrams illustrating an effect of encroachment when the method of etching according to the embodiment is applied to the via step and the like. Schematic plan views and cross sectional views are illustrated for a line-and-space (L/S) pattern that includes lines L aligned having predetermined spaces S interposed. As illustrated in a diagram around the upper center in FIG. 7, in the pattern that includes the lines L aligned having the predetermined spaces S interposed, encroachment is a difference between a width L1 of a line L before holes VH are formed on the pattern, and a width L2 of the line L after the holes VH have been formed, and defined as L1-L2.

The via step on the left side in FIG. 7 is a comparative example, and illustrates an example of an etching result in a case where the $SiF_4$ gas was not added to the process gas that includes fluorocarbon when etching the low-k film 201 with the TiN film 203 as the mask. The center in FIG. 7 is an example of the embodiment, and illustrates an example of an etching result in a case where the $SiF_4$ gas was added to the process gas that includes fluorocarbon when etching the low-k film 201 with the TiN film 203 as the mask. The right in FIG. 7 is an example of the embodiment, and illustrates an example of an etching result in a case where the $SiF_4$ gas was added to the process gas that includes fluorocarbon in a trench step.

According to the results, the encroachment is "8.2" in the case where the $SiF_4$ gas was added to the process gas that includes fluorocarbon according to the embodiment in the via step, whereas the encroachment in the comparative example is "18.4" in which the $SiF_4$ gas was not added. Therefore, as the result of applying the method of etching according to the embodiment to the via step, it can be seen that a part of the TiN mask is hardly encroached, and hence, encroachment is prevented. Also, as designated in FIG. 7 by frames of bold dashed lines, the residual film of the mask increases when the $SiF_4$ gas is added to the process gas as in the embodiment in the via step and the trench step, compared to the comparative example in which the $SiF_4$ gas was not added. In other words, it can be seen that the mask selectivity is improved.

[Etching Result 3]

Figure 8A:
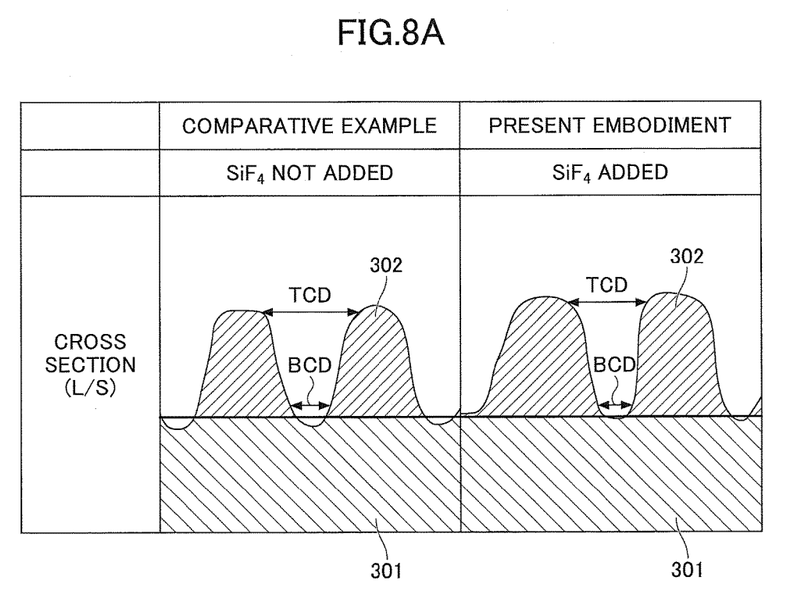
FIGS. 8A-8B are diagrams illustrating an example of a result of etching when a method of etching according to an embodiment is applied to an etching process of SiARC.
Figure 8B:
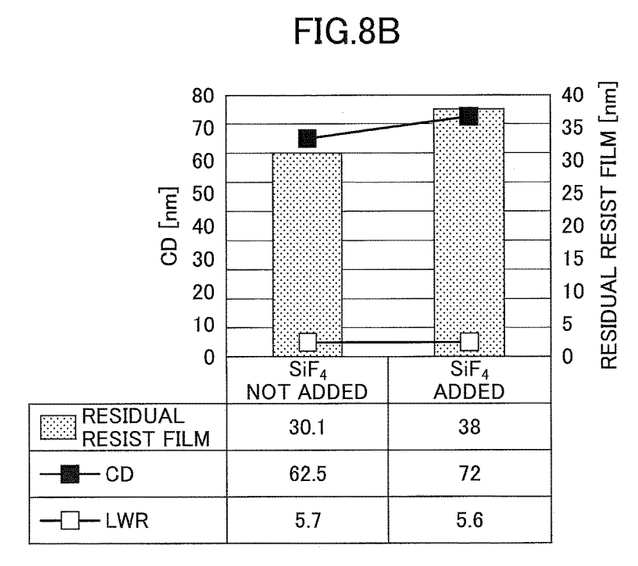

FIGS. 8A-8B illustrate an example of a result of etching when the method of etching according to the embodiment is applied while etching an Si-containing Anti-Reflective Coating (SiARC) film. The left side of FIG. 8A illustrates an example of an etching result in a case where the $SiF_4$ gas was not added to the process gas that includes fluorocarbon when etching an SiARC film 302 on a base film 301 with an organic film as the mask. The right side of FIG. 8A illustrates an example of an etching result in a case where the $SiF_4$ gas was added to the process gas that includes fluorocarbon when etching the SiARC film 302 on the base film 301 with an organic film as the mask.

Specifically, FIGS. 8A-8B illustrate the results of etching the Si-ARC301 by the method of etching according to the embodiment under the following etching conditions.

(Etching Conditions)
the temperature of the placing table: 10° C.;
the first high frequency power HF: 300 W;
the second high frequency power LF: 100 W;
the negative DC voltage DC: applied;
the gas: $H_2$, Ar, $SiF_4$ gas; and
the pressure: 50 mT (6.6661 Pa).

In FIG. 8A and FIG. 8B, the SiARC film 302 in the comparative example (the $SiF_4$ gas not added) exhibits thinner tips compared to those of the SiARC film 302 in the embodiment (the $SiF_4$ gas added), namely, a CD shrink is generated in which the difference between the top CD (TCD, or the CD at the upper part of a hole) and the bottom CD (BCD, or the CD at the bottom part of the hole) of the SiARC film 302 becomes greater. In contrast to this, the CD shrink is smaller in the embodiment, and a favorable etched shape is obtained.

Also, as illustrated in FIG. 8B, the SiARC film 302 in the embodiment (the $SiF_4$ gas added) has the residual film remained more than that of the SiARC film 302 in the comparative example (the $SiF_4$ gas not added), and hence, it can be seen that the mask selectivity is improved.

[Etching Result 4]

Figure 9A:
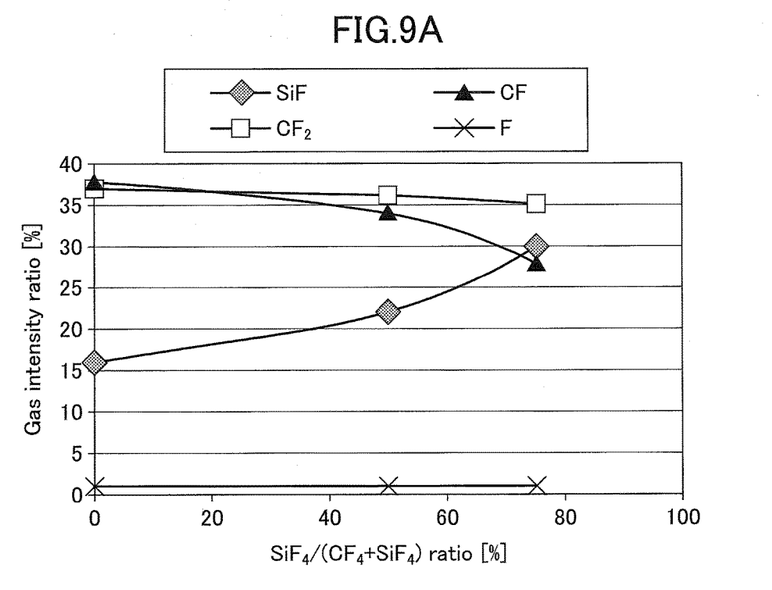
FIGS. 9A-9B are diagrams illustrating an example of the flow ratio of $SiF_4$ gas and the mask selectivity according to an embodiment.

The horizontal axis in FIG. 9A represents the flow ratio of the $SiF_4$ gas to the entire gas ($CF_4+SiF_4$). The vertical axis in FIG. 9A represents ratios of intensities of SiF, $CF_2$, CF, and F in the plasma. Note that when measuring the intensities, the intensity of $CF_2$ is obtained by detecting light having the wavelength of 252 nm. The intensity of CF is obtained by detecting light having the wavelength of 256 nm. The intensity of F is obtained by detecting light having the wavelength of 704 nm.

According to the results, it can be seen that the composition of the plasma can be changed by changing the flow ratio of the $SiF_4$ gas to the entire gas ($CF_4+SiF_4$). Specifically, it can be seen that the greater the flow ratio of the $SiF_4$ gas to the entire gas ($CF_4+SiF_4$) becomes, the more the CF component having a higher order ($CF_2$) relatively increases than the CF component and the F component having lower orders.

Figure 9B:
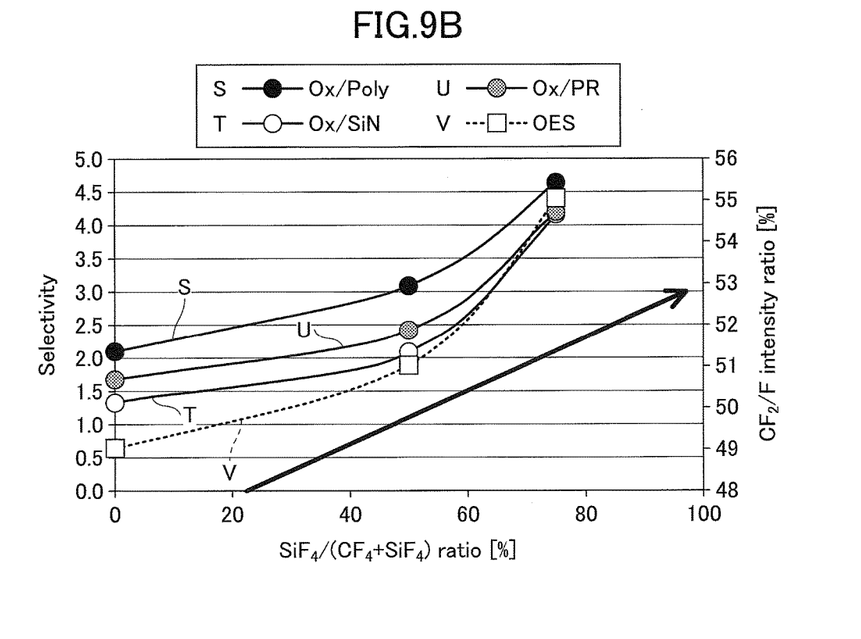

The horizontal axis in FIG. 9B represents the flow ratio of the $SiF_4$ gas to the entire gas ($CF_4+SiF_4$). The vertical axis (on the left side) in FIG. 9B represents the mask selectivity, and the vertical axis (on the right side) in FIG. 9B represents the ratio of the intensity of $CF_2$ with respect to F in the plasma.

In FIG. 9B, a solid line S represents the mask selectivity obtained when etching the silicon oxide film with a resist film of polysilicon as the mask. A solid line T represents the mask selectivity obtained when etching the silicon oxide film with a silicon nitride (SiN) film as the mask. A solid line U represents the mask selectivity obtained when etching the silicon oxide film with a photoresist film (PR) as the mask. A solid line V represents the emission intensity ratio of $CF_2/F$ in the plasma, obtained by OES (Optical Emission Spectroscopy). OES is a method that qualitatively analyzes the wavelength of a bright line spectrum (an atomic spectrum) inherent to an element obtained in discharge plasma, and quantitatively analyzes it from the light emission intensity.

According to the analysis, it can be seen that the higher the flow ratio of the $SiF_4$ gas to the entire gas ($CF_4+SiF_4$) becomes, the more the mask selectivity is improved. Thus, it can be seen that the higher flow ratio of the $SiF_4$ gas in the process gas can improve the mask selectivity more. Further, it can be seen that the higher the flow ratio of the $SiF_4$ gas to the entire gas ($CF_4+SiF_4$) becomes, the more the CF component having a higher order ($CF_2$) relatively increases than the CF component and the F component having lower orders.

[Addition of $SiF_4$ Gas and Mask Selectivity]

Next, addition of the $SiF_4$ gas and the mask selectivity will be described. From the etching results described above, a relationship may be anticipated in that the mask selectivity is improved if the higher-order CF component ($CF_2$) in the plasma relatively increases than the lower-order CF component and F component.

As an antecedent, it has been understood that if the residence time (time during which radicals stay in the plasma space) is longer, CF radicals dissociates to F radicals, the ratio of the F radicals becomes relatively higher than the CF radicals in the plasma.

Here, an example is taken in which etching is executed on a silicon oxide film ($SiO_2$) with a titanium nitride (TiN) film as the mask, to present chemical reaction formulas when generating F-rich plasma (plasma in which the ratio of F radicals is relatively higher than CF radicals) from $SiF_4$ gas.

From $SiF_4$ gas to F-rich plasma (1-1)

(1-2)

Similarly, chemical reaction formulas are presented when generating CF-rich plasma (plasma in which the ratio of CF radicals is relatively higher than F radicals) from the $SiF_4$ gas.

From $SiF_4$ gas to CF-rich plasma (2-1)

(2-2)

Figure 10:
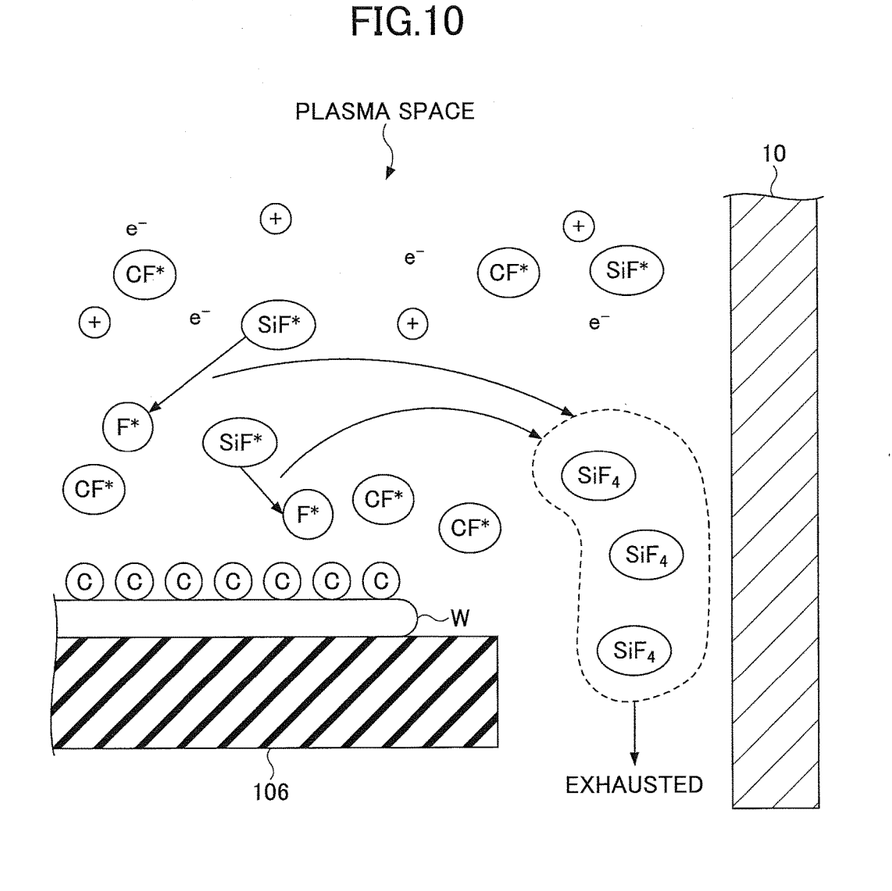
FIG. 10 is a diagram illustrating a mechanism addition of $SiF_4$ gas and the mask selectivity according to an embodiment.

Comparing these two sets of chemical formulas, it can be seen that the CF-rich plasma has carbon C piled up on the surface of the mask of titanium nitride as represented in formula (2-1). With reference to FIG. 10 that schematically illustrates the plasma space above the wafer W in the etching apparatus 1, the mechanism will be described in which carbon C piles up on the surface of the mask of titanium nitride by action of the CF-rich plasma.

When $SiF_4$ gas is added to the process gas that includes fluorocarbon gas supplied into the process chamber 10, plasma is generated that includes electrons, ions, CF radicals (CF*), F radicals (F*), and SiF radicals (SiF*). The SiF radicals in the plasma chemically react with the F radicals to become $SiF_4$. Since the vapor pressure of $SiF_4$ is high, $SiF_4$ immediately volatilizes. Therefore, $SiF_4$ that has become gas is exhausted out of the process chamber 10.

On the other hand, the SiF radicals does not react with the CF radicals. Consequently, in the plasma, the concentration of the F radicals does not increase, and the concentration of the CF radicals does not decrease. Therefore, even if the residence time is longer in the plasma, a CF-rich state of the plasma is maintained in which the ratio of the CF radicals is relatively higher than the F radicals. Thus, carbon C in the plasma piles up on the surface of the mask of titanium nitride, and a carbon layer coats the mask. In the method of etching according to the embodiment, it can be considered that the carbon layer on the mask surface functions as a protective film during the etching, and hence, the mask selectivity is improved.

[Etching Result 5]

Finally, with reference to FIG. 11, an etching result 5 will be described in a case where the method of etching according to the embodiment is applied. The left side in FIG. 11 represents an example of an etching result in the via step and the trench step, in a case where the $SiF_4$ gas was added by an added amount A to the process gas that includes $CF_4$ gas and Ar gas, and the right side in FIG. 11 represents an example of an etching result in a case where the $SiF_4$ gas was added by an added amount B, which is greater than the added amount A, to the process gas that includes $CF_4$ gas and Ar gas.

In both cases, etching results are illustrated that were obtained at a wafer position having the distance 30 mm from the edge of the wafer W having the diameter 300 mm, and at a wafer position having the distance 5 mm from the edge of the wafer. According to the results, the mask selectivity is improved for the mask (for example, a TiN film 203) on the circumference at 30 mm and the outer circumference at 5 mm from the edge of the wafer W, and the film to be etched (for example, a low-k film 201) exhibits a favorable etched shape without tapering tips.

Figure 11:
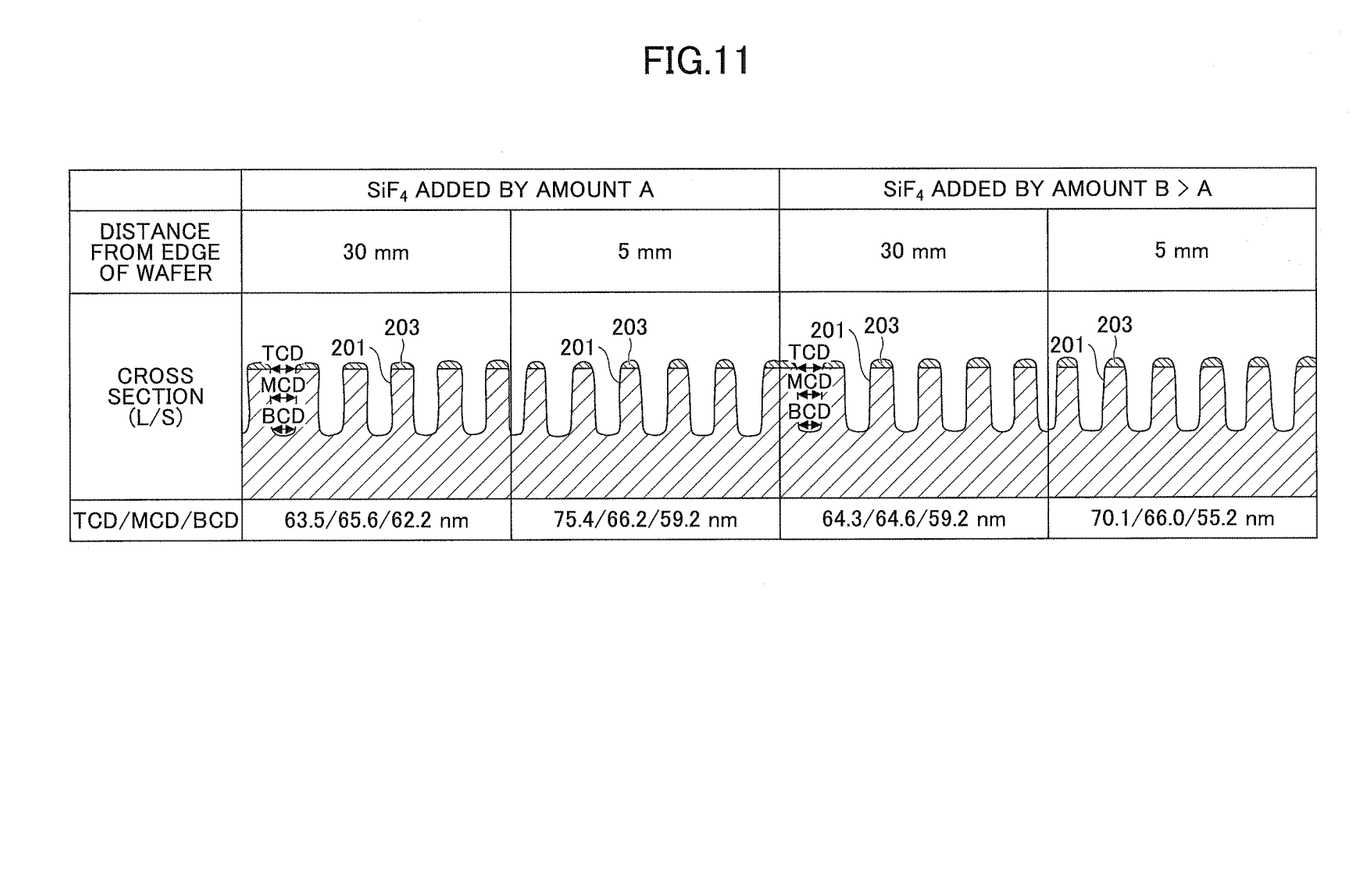
FIG. 11 is a diagram illustrating examples of added amounts of $SiF_4$ gas and the mask selectivity according to an embodiment.

Also, it can be seen that by increasing the amount of added $SiF_4$ gas as illustrated on the right side in FIG. 11, differences between the top CD (TCD, or the CD at the upper part of a hole), the middle CD (MCD, or the CD at the middle part of the hole), and the bottom CD (BCD, or the CD at the bottom part of the hole) become smaller on both the circumference at 30 mm and the outer circumference at 5 mm from the edge of the wafer W. As such, by the method of etching according to the embodiment, perpendicularity of etching is secured even on the side of the outer circumference of the wafer W, on which uniform etching has been difficult to be obtained. Thus, by the method of etching according to the embodiment, the mask selectivity can be improved on circumferences of the wafer, as well as inner circumferences.

As has been described, by adding $SiF_4$ gas to a process gas that includes fluorocarbon, the mask selectivity can be improved on a wafer W entirely including an outer circumference.

However, if the process gas includes carbon dioxide ($CO_2$) gas, carbon monoxide (CO) gas, or oxygen ($O_2$) gas, an oxide film SiO is generated and piled up during the etching, and hence, the etching becomes difficult. Therefore, the process gas used for the method of etching according to the embodiment does not include gas including both carbon C and oxygen O. Also, the process gas used for the method of etching according to the embodiment does not include oxygen $O_2$ gas.

So far, the methods of etching have been described by the above embodiments. Note that the methods of etching according to the present invention are not limited to the above embodiments, but may be changed and improved in various ways within the scope of the present invention. The subject matters described in the embodiments described above may be combined as far as no inconsistency is introduced.

For example, the methods of plasma etching according to the present invention are applicable to a capacitively coupled plasma (CCP) apparatus. On the other hand, it may be difficult to apply the methods of etching according to the present invention to an inductively coupled plasma (ICP) apparatus as another plasma apparatus.

An ICP apparatus generates plasma in an upper part of the process chamber, does not have the plasma spread in the process chamber, process chamber, but rather, has a mechanism to have the plasma attracted to the placing table placed downwards. In contrast to that, a CCP apparatus exemplified with the etching apparatus 1 in FIG. 1 has the generated plasma spread in the process chamber 10 over the upper part, the lower part, the side wall, and the like. In this way, a CCP apparatus has the plasma spread in its plasma space. Therefore, contribution of the plasma on the edge side of a wafer W is greater than that in an ICP apparatus. Therefore, compared to use in an ICP apparatus, the method of etching according to the present invention used in a CCP apparatus realizes a greater effect of the mask selectivity improvement and the like on the circumference side of the wafer W by adding $SiF_4$ gas to the process gas, than in the case of the ICP apparatus.

In the present specification, although a semiconductor wafer W has been described as an object to be etched, but the object to be etched may be any of substrates used for LCDs (Liquid Crystal Displays), FPDs (Flat Panel Displays), photomasks, CD substrates, print circuit boards, and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A method of etching an insulation layer on an object to be processed in a process chamber in which an upper electrode and a lower electrode are placed facing each other, the method comprising:
    supplying a process gas that includes fluorocarbon gas and silicon tetrafluoride ($SiF_4$) gas into the process chamber;
    applying electric power to at least one of the upper electrode and the lower electrode, to generate plasma; and
    etching the insulation layer by the generated plasma via a mask,
    wherein the supplying controls a ratio of the silicon tetrafluoride gas with respect to a total amount of flow of the process gas so that a concentration of CF radicals is more than a concentration of F radicals in the generated plasma.

2. The method of etching as claimed in claim 1, wherein the applying supplies a negative DC voltage to the upper electrode.

3. The method of etching as claimed in claim 1, wherein the process gas includes carbon tetrafluoride ($CF_4$) gas, and the supplying controls a flow ratio of the silicon tetrafluoride gas supplied into the process chamber with respect to the carbon tetrafluoride gas and the silicon tetrafluoride gas, to fall in a range between 10% and 75%.

4. The method of etching as claimed in claim 3, wherein the supplying further controls the flow ratio of the silicon tetrafluoride gas supplied into the process chamber with respect to the carbon tetrafluoride gas and the silicon tetrafluoride gas, to fall in a range between 50% and 75%.

5. The method of etching as claimed in claim 1, wherein the insulation layer is one of a low-k film, a silicon oxide film, and an Si-containing anti-reflective coating film.

6. The method of etching as claimed in claim 1, wherein the method of etching is a method of etching the object to be processed, by the plasma generated in a capacitively coupled plasma apparatus.

7. The method of etching as claimed in claim 1, wherein the process gas is a gas that does not include a gas including carbon atoms C and oxygen atoms O, and not include oxygen ($O_2$) gas.

* * * * *